US006118394A

United States Patent [19]

Onaya

[11] Patent Number: 6,118,394

[45] Date of Patent: Sep. 12, 2000

[54] CIRCUIT FOR OBTAINING AN OUTPUT SIGNAL HAVING DISTRIBUTED FREQUENCIES AROUND A FREQUENCY OF AN INPUT SIGNAL

[75] Inventor: Masato Onaya, Gunma-ken, Japan

[73] Assignee: Sanyo Electric Co., Ltd., Osaka, Japan

[21] Appl. No.: 08/969,141

[22] Filed: Nov. 12, 1997

[30] Foreign Application Priority Data

| | | | |
|---|---|---|---|
| Nov. 13, 1996 | [JP] | Japan | 8-302192 |
| Nov. 29, 1996 | [JP] | Japan | 8-320356 |
| Nov. 29, 1996 | [JP] | Japan | 8-320358 |

[51] Int. Cl.[7] .......... H03M 1/00

[52] U.S. Cl. .......... 341/110; 341/123; 84/602; 381/63

[58] Field of Search .......... 341/110, 123; 381/18, 63; 84/602, 603, 604, 605, 630

[56] References Cited

U.S. PATENT DOCUMENTS

| | | | |
|---|---|---|---|
| 3,023,277 | 2/1962 | Mathews | 381/63 |
| 4,035,783 | 7/1977 | Mathewson | 341/110 |
| 4,370,643 | 1/1983 | Kitamura | 341/123 |
| 5,308,916 | 5/1994 | Murata et al. | 84/603 |
| 5,444,784 | 8/1995 | Toyama | 381/63 |
| 5,469,508 | 11/1995 | Vallier | 381/63 |
| 5,576,709 | 11/1996 | Onaya | 341/110 |

FOREIGN PATENT DOCUMENTS

| | | |
|---|---|---|
| 7-38435 | 2/1995 | Japan . |

*Primary Examiner*—Howard L. Williams
*Attorney, Agent, or Firm*—Hogan & Hartson LLP

[57] ABSTRACT

In a surround circuit, an audio signal or another analog signal is converted to a digital signal by an A/D conversion circuit (11) and stored in a memory (12). Subsequently, the digital signal read from the memory (12) is converted to an analog signal by a D/A conversion circuit (13). The memory (12) then functions as a delay circuit, and a delayed audio signal is obtained. By superimposing the obtained delay signal to the transmitted audio signal, a surround sound is obtained. Here, a sampling frequency of either one of the A/D conversion circuit (11) and the D/A conversion circuit (13) is changed with an elapse of time, which leads the sampling frequency of the A/D conversion circuit (11) to differ from that of the D/A conversion circuit (13), and the frequency of an output signal of the D/A conversion circuit (13) differs from that of the audio signal transmitted to the A/D conversion circuit (11). Consequently, a delay signal in which the frequency of the input audio signal is dispersed can be obtained.

32 Claims, 12 Drawing Sheets

CIRCUIT FOR OBTAINING AN OUTPUT SIGNAL HAVING DISTRIBUTED FREQUENCIES AROUND A FREQUENCY OF AN INPUT SIGNAL

BACKGROUND OF THE INVENTION

1. Field of the Invention

The present invention relates to a surround circuit using an A/D conversion circuit, a delay circuit and a D/A conversion circuit.

2. Description of the Related Art

A conventional audio reproducing apparatus is provided with a mode for reproducing the sound of music as heard wihin a concert hall, a stadium, a church or other surrounding sound fields. By operating the audio apparatus, a listener can obtain a desired surround mode. Such surrounding is for the most part produced by delaying audio signal components for a predetermined time to produce a simulated reflected sound by superimposing an audio reproduced sound and the simulated reflected sound. FIG. 1 shows a conventional surround circuit for producing a surround sound.

In FIG. 1, an audio signal is applied via an input terminal IN to an A/D conversion circuit 1, where it is converted to a digital signal by a sampling signal of a fixed frequency. The digital signal is delayed in a delay circuit 2, which delays components of the digital signal by different delay times. Therefore, the delay circuit 2 generates an output signal al delayed by a first delay time, an output signal a2 delayed by a second delay time longer than the first delay time, an output signal a3 delayed by a third delay time longer than the second delay time, and an output signal a4 delayed by a fourth delay time longer than the third delay time.

The output signals a1 to a4 of the delay circuit 2 are converted to analog signals on a fixed sampling frequency in respective first to fourth D/A conversion circuits 4 to 7. Output signals of the first to fourth D/A conversion circuits 4 to 7 are added in an addition circuit 8. An output signal of the addition circuit 8 and the audio signal from the input terminal IN are added in an addition circuit 10. Therefore, an output signal of the addition circuit 10 is constituted by superimposing onto the audio signal signals for reproducing various simulated reflected sounds onto the audio signal.

However, in the circuit of FIG. 1, to produce various simulated reflected sounds, the delay circuit 2 generates a number of output signals with different delay times. There is causes a problem that a number of D/A conversion circuits corresponding to the output signals of the delay circuits 2 must be used, which may be a large number. Therefore, such circuits are disadvantageously complicated and their size is enlarged.

SUMMARY OF THE INVENTION

An object of the present invention is to provide a surround circuit sounds with a simple constitution which can generate various simulated reflected.

To attain this and other objects, the invention provides a surround circuit in which an A/D conversion circuit converts an input signal to a digital signal with a sampling signal having a certain frequency, an output signal of the A/D conversion circuit is delayed in a delay circuit while the frequency of the sampling signal changes, and a D/A conversion circuit converts an output signal of the delay circuit to an analog signal on a frequency different from a sampling frequency of the A/D conversion circuit. Since in the same digital signal the frequency of the sampling signal differs from the time of digital conversion to the time of analog conversion, an output frequency of the surround circuit differs from an input frequency of the same circuit. Output signals having various frequencies can thereby be obtained. When the output signal of the D/A conversion circuit is superimposed onto the input signal, certain frequency components of the input signal are reduded. Therefore, a state in which an original audio signal and an echo signal can be simulatedly superimposed. Therefore, with one D/A conversion circuit, a simulated sound field can be reproduced. Circuit constitution therefore can be simplified and a circuit size can be reduced.

When a shift register is used as the delay circuit instead of a memory, a simulated sound field can be reproduced with one D/A conversion circuit and a constitution of a delay circuit can be simplified.

According to another aspect of the invention, an input analog signal is full-wave rectified and thereafter smoothed, and a frequency of a sampling signal is changed by a smoothed signal. In an A/D conversion circuit an input signal is digital-converted with a sampling signal having a certain frequency. While an output signal of the A/D conversion circuit is delayed in a delay circuit, the frequency of the sampling signal changes. For frequencies other than a sampling frequency in the A/D conversion circuit, a D/A conversion circuit digital-converts an output signal of the delay circuit. Since for the same data the frequency of the sampling signal differs from the time of digital conversion to the time of analog conversion, the output and input frequencies of the surround circuit differ.

According to a further aspect of the invention, an A/D conversion circuit converts an input signal to a digital signal with a first sampling signal having a fixed frequency, an output signal of the A/D conversion circuit is delayed in a delay circuit, and a D/A conversion circuit then converts an output signal of the delay circuit to an analog signal with a second sampling signal whose frequency changes with an elapse of time. Also, in a case of A/D conversion with the second sampling signal, the D/A conversion is performed on the fixed frequency. Since in the same digital signal the frequency of the sampling signal differs from the time of digital conversion to the time of analog conversion, output and input frequencies of the surround circuit differ.

DETAILED DESCRIPTION OF THE PREFERRED EMBODIMENTS

Embodiments are now described with reference to the accompanying drawings.

First Embodiment

Figure 1:
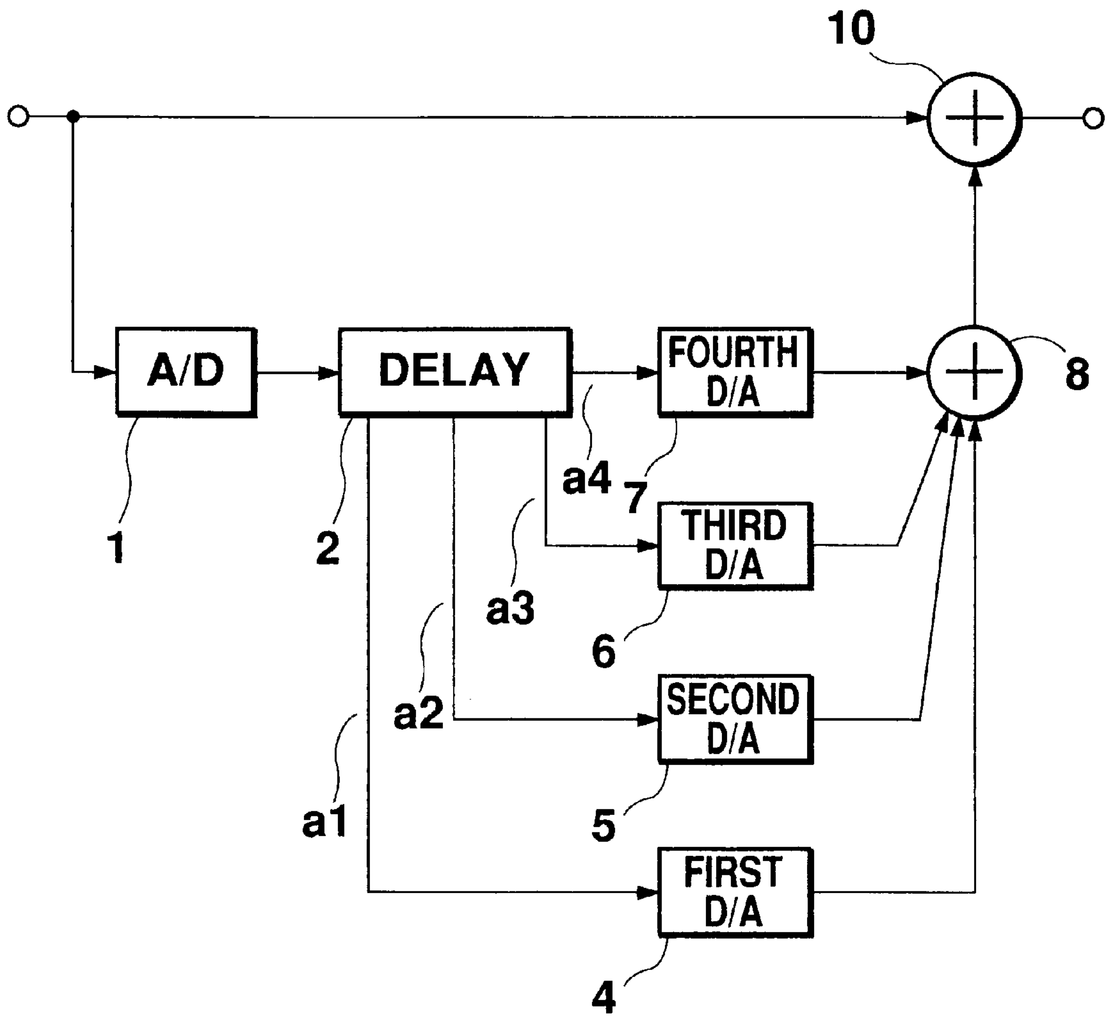
Fig. 1 PRIOR ART
FIG. 1 is a block diagram showing a constitution of a related surround circuit.
Figure 2:
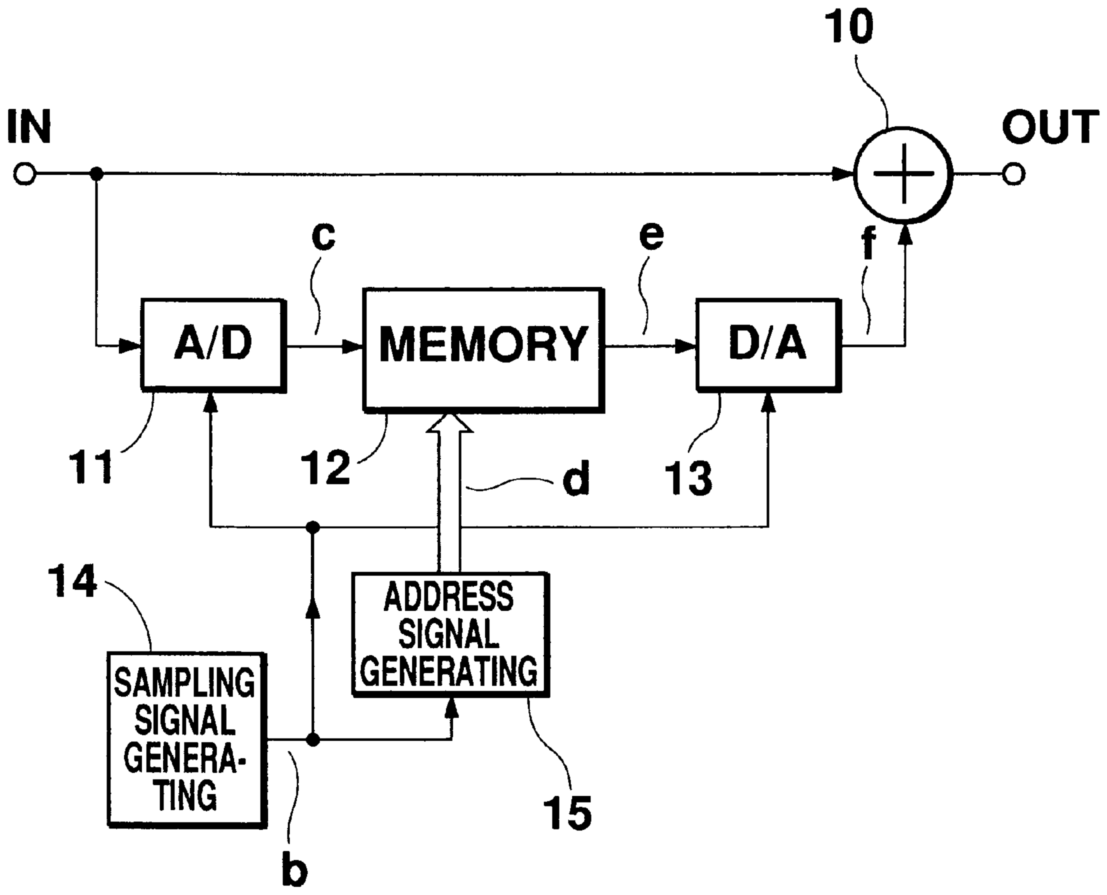
FIG. 2 is a block diagram showing a constitution of a surround circuit according to a first embodiment of the invention.

FIG. 2 shows a first embodiment, in which 11 is an A/D conversion circuit for converting an input audio signal to a digital signal with a sampling signal whose frequency changes with an elapse of time, 12 is a memory for storing an output signal of the A/D conversion circuit 11 and constituting a delay circuit, 13 is a D/A conversion circuit for converting an output signal of the memory 12 to an analog signal with a sampling signal whose frequency changes over time, 14 is a sampling signal generating circuit for generating a sampling signal whose frequency changes over time, and 15 is an address signal generating circuit for generating an address signal which is used for writing and reading of the memory 12 in response to the sampling signal. In FIG. 2, circuits corresponding to those in FIG. 1 are denoted using the same symbols and their explanation is not repeated.

In FIG. 2, in the A/D conversion circuit 11 an input audio signal is converted to a digital signal c on a sampling frequency which is determined by a sampling signal b from the sampling signal generating circuit 14. Since the sampling signal b changes over time, the sampling frequency of the A/D conversion circuit 11 also changes as time elapses.

The output digital signal c of the A/D conversion circuit 11 is stored in an address of the memory 12 which is designated by a writing address signal d from the address signal generating circuit 15. Subsequently, the aforementioned output digital signal is read with the reading address signal d from the address signal generating circuit 15. In this case, the sampling frequency when a certain digital signal c is written in the memory 12 differs from that when the same digital signal e is read from the memory 12. Specifically, a writing address is separated from a reading address by a predetermined space, and a difference between the addresses becomes a delay time. Here, the address signal generating circuit 15 generates the address signal d in synchronism with a frequency of the sampling signal b. While the same output digital signal c is stored in the memory 12, the frequency of the sampling signal changes with time. Therefore, for the same digital signal the sampling frequency differs with the time of writing or reading of the memory 12. Also, the writing address signal d differs in generating timing with the reading address signal d for the same digital signal.

Subsequently, in the D/A conversion circuit 13 the output digital signal e from the memory 12 is converted to an analog signal f on a sampling frequency which is determined by the sampling signal b. In this case, the frequency of the sampling signal b changes from when the digital signal c is stored in the memory 12. Therefore, the output digital signal e of the memory 12 is converted to an analog signal on a sampling frequency different from the sampling frequency of the A/D conversion circuit 11. Thereafter, the output signal f of the D/A conversion circuit 13 is added to the input signal of the input terminal IN in the addition circuit 10.

Figure 3A:
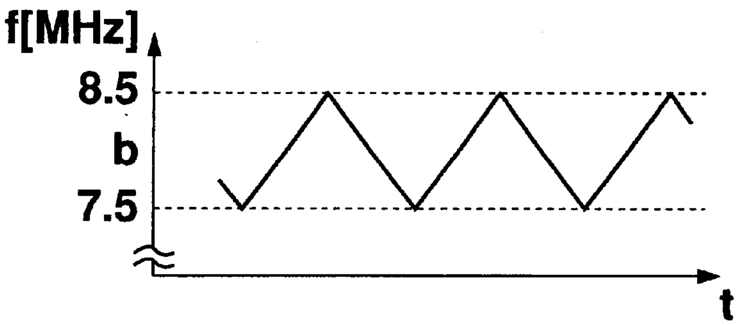
FIGS. 3A, 3B, 3C and 3D show waveforms of signals from respective portions of the surround circuit in the first embodiment.
Figure 3B:
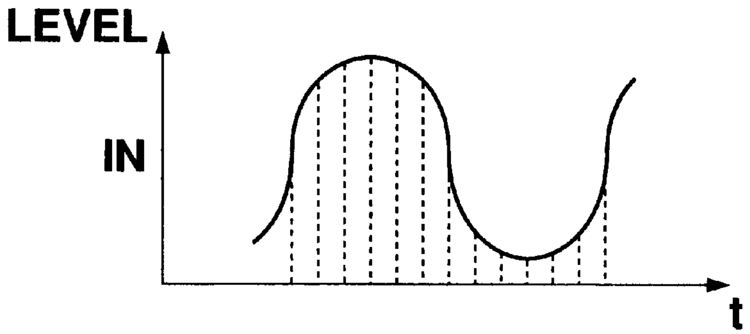
Figure 3C:
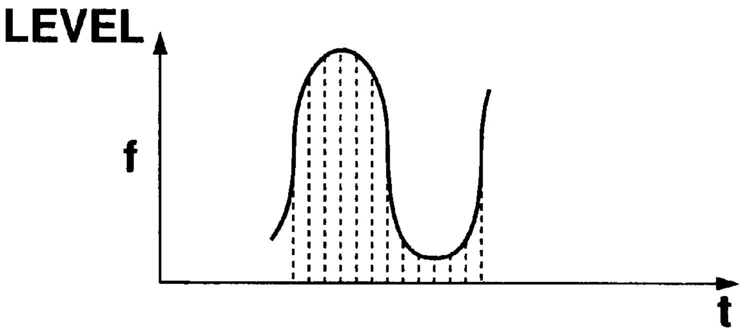

A state of input and output signals of the surround circuit shown in FIG. 2 is described using specific numeral values. First, as shown in FIG. 3A, the frequency of the sampling signal b from the sampling signal generating circuit 14 changes within a range of between 7.5 MHz and 8.5 MHz in a triangular waveform having a cycle of 10 Hz. For example, when the sampling frequency of the A/D conversion circuit 11 is 7.5 MHz, an input signal as shown in FIG. 3B is applied to the A/D conversion circuit 11. Then, the input signal is converted to the digital signal c at an interval defined by dotted lines in FIG. 3B. Subsequently, the frequency of the sampling signal d changes, and the output signal c of the A/D conversion circuit 11 is written in the memory 12 with the writing address signal d substantially in synchronism with the sampling signal of 7.5 MHz. Subsequently, while the output signal c is delayed in the memory 12, the sampling signal b changes from 7.5 MHz to 8.5 MHz. After delay, the output digital signal e is read from the memory 12 in response to the reading address signal d substantially in synchronism with the sampling signal b of 8.5 MHz. When the digital signal e is read, the sampling frequency of the D/A conversion circuit 13 is 8.5 MHz. Therefore, by converting the output digital signal e to the analog signal, the output analog signal f of the D/A conversion circuit 13 becomes a signal as shown in FIG. 3C. In FIG. 3C, an interval of analog conversion is narrower than the interval of digital conversion at 7.5 MHz. Specifically, after a certain input signal is A/D converted on the sampling frequency of 7.5 MHz, a corresponding digital signal is D/A converted on a sampling frequency of 8.5 MHz. Thereby, as compared with the input signal of the input terminal IN, a cycle of the output analog signal f of the D/A conversion circuit 13 is shorter and its frequency is higher.

Considering in the same manner, for example, in a case of A/D conversion of the input signal IN on the sampling frequency of 8.5 MHz, when the corresponding digital signal is applied to the D/A conversion circuit 13, the sampling frequency changes to 7.5 MHz. In this case, the sampling interval at the time of D/A conversion is wider than at the time of A/D conversion. Therefore, the output signal f of the D/A conversion circuit 13 has a longer cycle and lower frequency than the input signal of the input terminal IN. In this manner, when the input signal is applied to the A/D conversion circuit 11, the frequency of the output analog signal f becomes higher or lower than the same input signal IN depending on whether the sampling frequency changes in a rising direction or a lowering direction.

Also, in the above example for the same digital signal, there is a 1 MHz frequency difference between the sampling signals at the time of analog conversion and the time of digital conversion. As stated above, if a time required for transmitting the output signal c of the A/D conversion circuit 11 to the D/A conversion circuit 13 is about half the cycle of the change insampling frequency, in the case of the sampling frequency of 7.6 MHz at the time of A/D conversion, then the sampling frequency for the same digital signal at the time of D/A conversion is 8.4 MHz, and the difference in frequency of the sampling signals is 0.8 MHz. Therefore, the sampling interval at the time of D/A conversion becomes wider than an amplitude of the sampling frequency of 1 MHz. The cycle of the output analog signal f becomes longer than in the case in which the difference in sampling frequency is 1 MHz. Therefore, on the sampling frequency when the input signal IN is applied to the A/D conversion circuit 11, one cycle of the output analog signal f corresponding to the input signal IN changes variously, and the frequency of the output analog signal f changes.

Figure 4A:
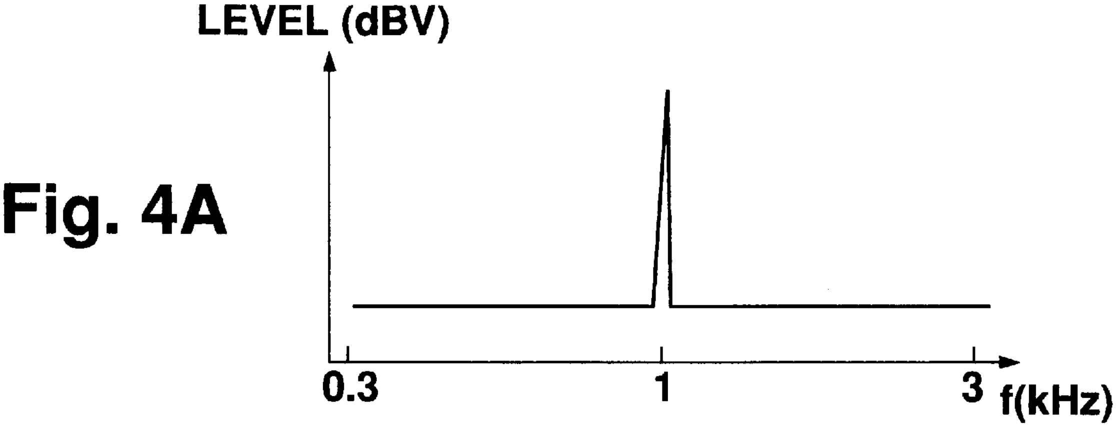
FIGS. 4A and 4B are characteristic views showing frequency components of input and output signals of the surround circuit in the first embodiment.
Figure 4B:
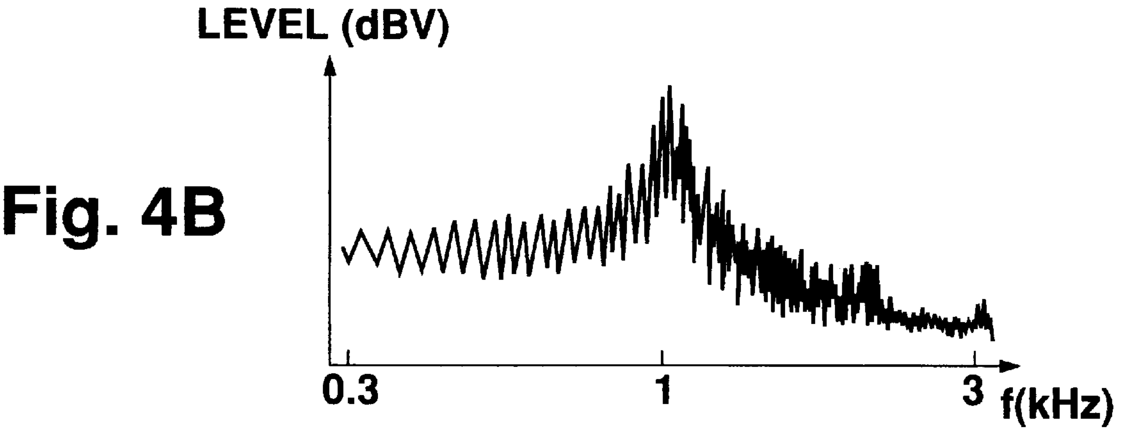

Therefore, when a certain input signal is applied to the A/D conversion circuit 11, the frequency of the output signal f from the D/A conversion circuit 13 corresponding to the same input signal changes depending on the sampling frequency of A/D conversion and whether that sampling frequency changes in a rising direction or a lowering direction. For example, when an input signal having a single frequency of 1 KHz as shown in FIG. 4A is applied to the input terminal IN, the output analog signal f of the D/A conversion circuit 13 has various frequency components as shown in FIG. 4B. The frequency of 1 KHz is dispersed to the other frequencies. By giving a regularity to the change in frequency of the sampling signal b, as shown in FIG. 4B frequencies can be dispersed symmetrically centering on the frequency of the input signal. The frequency of the output analog signal f is dispersed by successively and alternately repeating a dispersing movement from 1 KHz to a high frequency and then from that high frequency to 1 KHz and a dispersing movement successively from 1 KHz to a low frequency and from that low frequency to 1 KHz. Thereby, when in the addition circuit 10 the output signal of the D/A conversion circuit 13 is superimposed on the input signal of the input terminal IN, an output signal of the addition circuit 10 has another frequency component besides the frequency component of the input signal. Therefore, the frequency component of the input signal of the input terminal IN can be relatively reduced. By reducing the frequency component of the input signal, a simulated state in which an original audio signal and an echo signal are superimposed can be produced.

Figure 5:
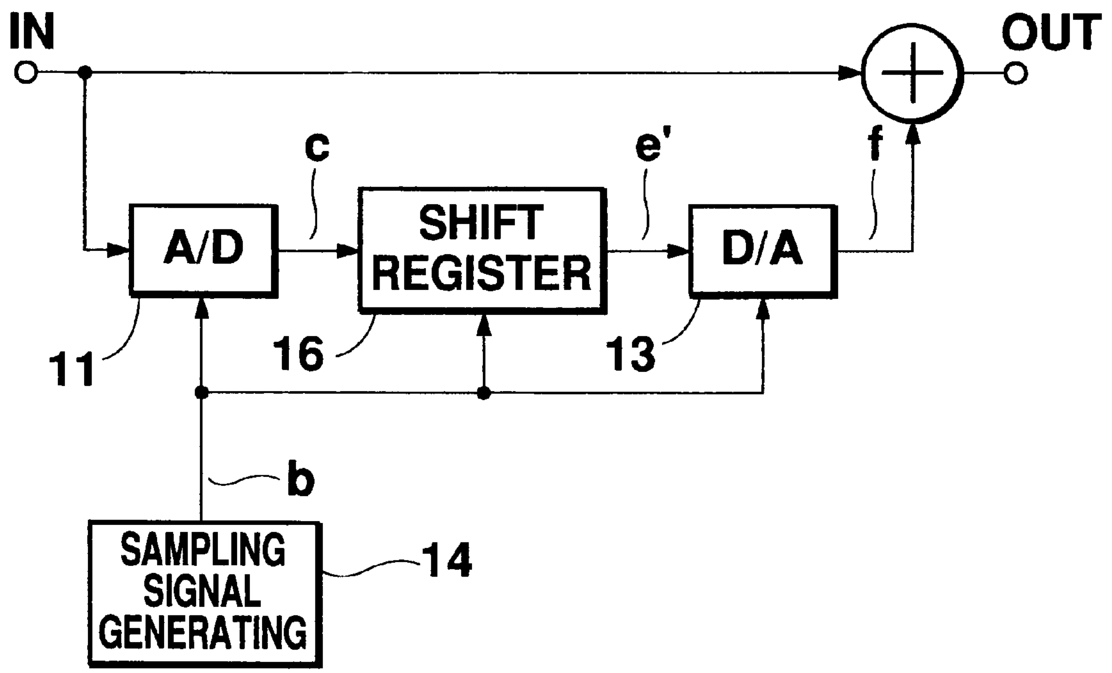
FIG. 5 shows a modification of the surround circuit of the first embodiment.

FIG. 5 shows a modification of the embodiment, which differs from the embodiment of FIG. 1 in that the memory 12 of FIG. 1 is replaced with an N-steps shift register 16. In FIG. 5, the sampling signal b is directly applied to the shift register 16 as a clock. Shifting of data in the shift register 16 is performed by the sampling signal b. The output signal c of the A/D conversion circuit 11 is taken by the sampling signal b into the shift register 16 and shifted therein. A shift time of the N-step shift register 16 is a delay time. Since the frequency of the sampling signal b changes with time, the output signal c of the A/D conversion circuit 11 is shifted while a shift speed of the shift register 16 changes with time. The frequency of the sampling signal b when the output signal c of the A/D conversion circuit 11 is applied to the shift register 16 differs from when the output signal is generated from the shift register 16. Therefore, the sampling frequency of the A/D conversion circuit 11 is different from the sampling frequency of the D/A conversion circuit 13 for the same digital signal. In the same manner as shown in FIG. 1, on an output end of the D/A conversion circuit 13, besides the frequency component of the input signal of the input terminal IN, another frequency component can be generated. Therefore, by relatively reducing the frequency component of the input signal of the input terminal IN, a simulated state in which the original audio signal and the echo signal are superimposed can be produced.

Figure 3D:
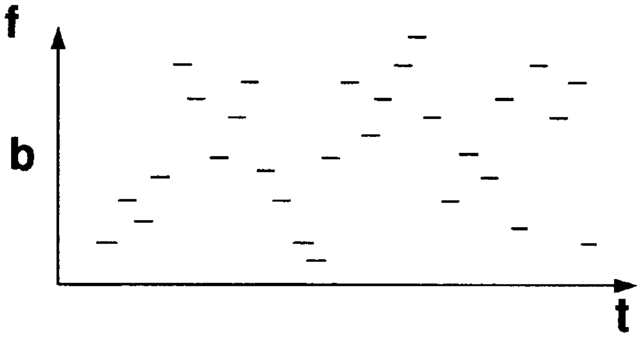

Turning to FIG. 2, the frequency of the sampling signal from the sampling signal generating circuit 14 is continuously changed, for example, in the frequency range of between 7.5 MHz and 8.5 MHz, as shown in FIG. 3A. Alternatively, the frequency of the sampling signal can be changed at random as shown in FIG. 3D. Since the frequency of the sampling signal changes at random, the output signal of the A/D conversion circuit 11 is delayed in the memory 12 while the sampling frequencies for the same digital signal at the time of A/D conversion and D/A conversion variously and randomly differ. When an input signal IN of 1 KHz is applied, the frequency of the output analog signal f as shown in FIG. 4B is obtained. Dispersed frequencies occur at random. Therefore, even if the frequency of the sampling signal is changed at random, in the same manner as when the frequency of the sampling signal is continuously changed, on the output end of the D/A conversion circuit 13, another frequency component can be generated in addition to the frequency component of the input signal of the input terminal IN.

Second Embodiment

Figure 6:
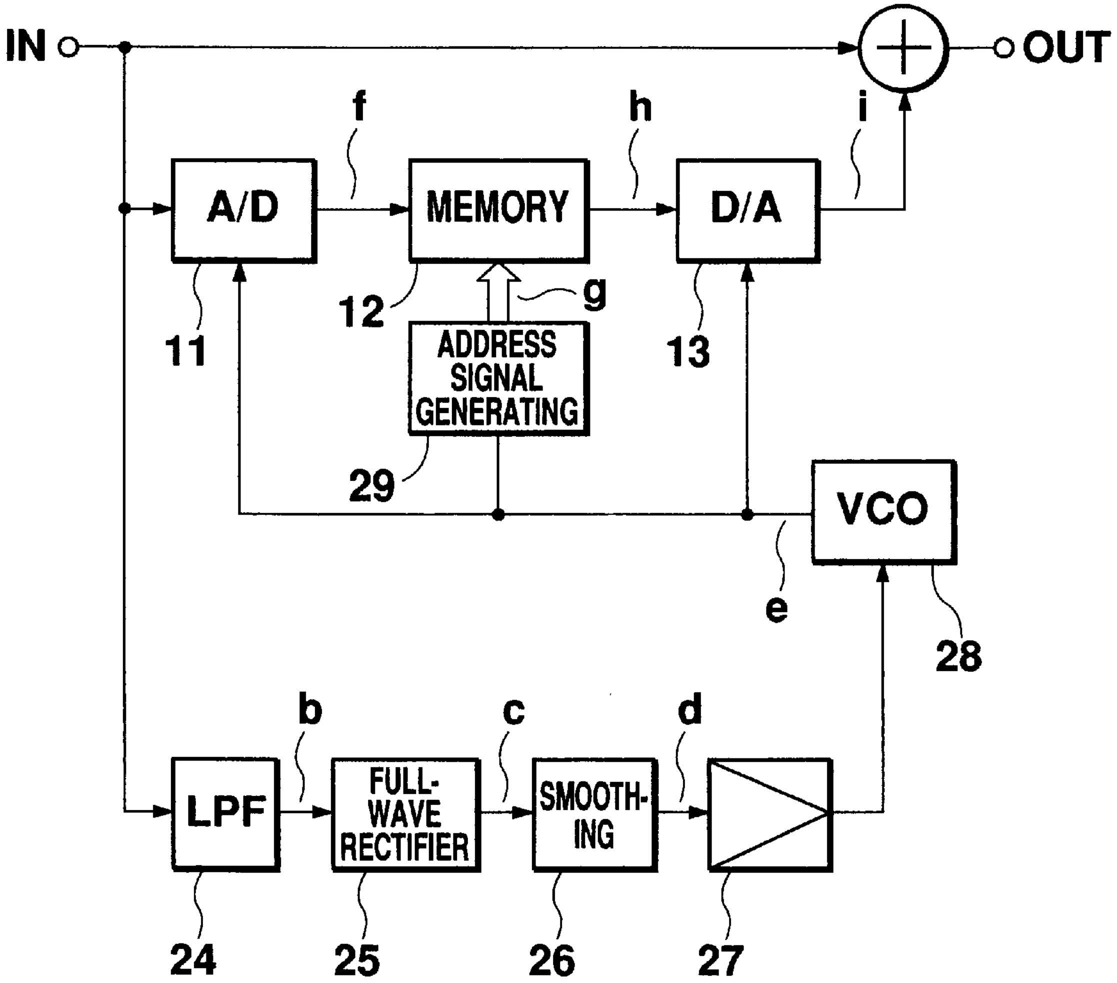
FIG. 6 is a block diagram showing a constitution of a surround circuit according to a second embodiment of the invention.

FIG. 6 shows a second embodiment, in which 11 is an A/D conversion circuit for converting an input audio signal to a digital signal with a sampling signal whose frequency changes with an elapse of time; 12 is a memory for storing an output signal of the A/D conversion circuit 11 and constituting a delay circuit; 13 is a D/A conversion circuit for converting an output signal of the memory 12 to an analog signal with a sampling signal whose frequency changes with an elapse of time; 24 is a low-pass filter (LPF) for passing a low-frequency component of the input audio signal; 25 is a full wave rectifier circuit for full-wave rectification of an output signal of the LPF 24; 26 is a smoothing circuit for smoothing an output signal of the full-wave rectifier circuit 25; 27 is an amplifier circuit for amplifying an output signal of the smoothing circuit 26; 28 is a VCO for generating a sampling signal and changing its output frequency in accordance with an output signal of the amplifier circuit 27; and 29 is an address signal generating circuit for generating an address signal for writing or reading of the memory 12 in response to the sampling signal from the VCO 28.

Figure 7A:
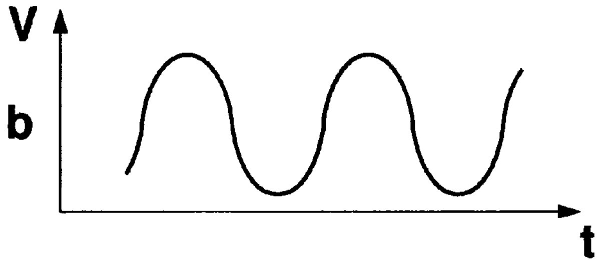
FIGS. 7A, 7B, 7C, 7D, 7E and 7F show waveforms of signals from respective portions of the surround circuit in the second embodiment.
Figure 7B:
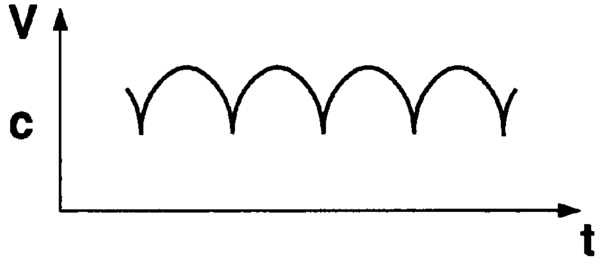
Figure 7C:
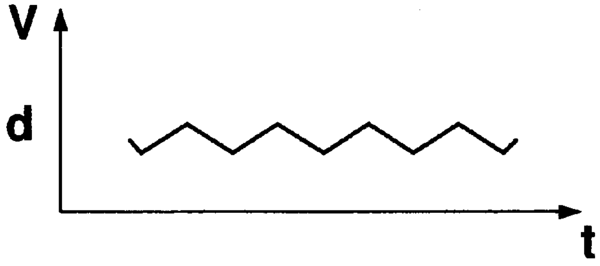
Figure 7D:
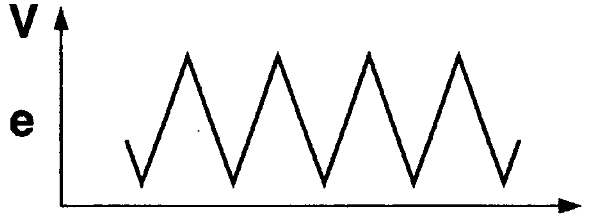

In FIG. 6, the input analog signal IN is applied to the LPF 24, and only its low-pass component passes through the LPF 24 without changing form. For example, an output signal b of the LPF 24 having a sinusoidal waveform as shown in FIG. 7A is full-wave rectified by the full-wave rectifier circuit 25, and its output signal c is in a state where a negative output signal is reversed to be a positive output signal as shown in FIG. 7B. The output signal c of the full-wave rectifier circuit 25 is smoothed in the smoothing circuit 26. Since a time constant of the smoothing circuit 26 is set so as to slowly follow the output signal c of the full-wave rectifier circuit, the output signal d of the smoothing circuit 26 changes slowly as shown in FIG. 7C. The output signal d of the smoothing circuit 26 is amplified in the amplifier circuit 27, and then applied to the VCO 28. An output frequency of the VCO 28 is determined by a level of an output signal of the amplifier circuit 27, while the output signal of the amplifier circuit 27 changes like the output signal d of the smoothing circuit 26. Therefore, the output signal e of the VCO 28 changes with an elapse of time as shown in FIG. 7D. Subsequently, the output signal e of the VCO 28 is applied to the A/D conversion circuit 11, to the address signal generating circuit 29 and to the D/A conversion circuit 13 as a sampling signal. Further, in the address signal generating circuit 29, the sampling signal serves as a clock for generating an address.

Figure 7E:
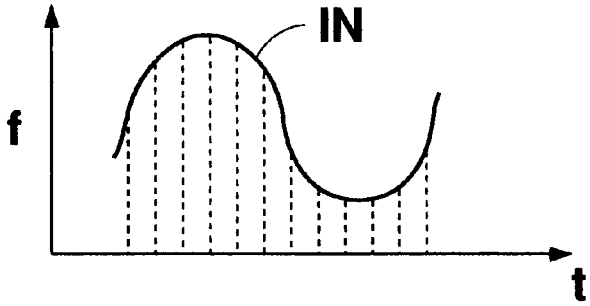

A circuit operation from the A/D conversion circuit 11 to the D/A conversion circuit 13 is described, provided that the sampling signal e of the VCO 28 changes between 7.5 MHz and 8.5 MHz in a triangular waveform of a cycle 10 Hz in response to the output signal of the amplifier circuit 27 as shown in FIG. 7D. In the A/D conversion circuit 11, the input audio signal IN is converted to the digital signal f with the sampling signal e of the VCO 28 whose frequency changes with an elapse of time. When the input audio signal IN is applied to the A/D conversion circuit 11, the sampling frequency is, for example, 7.5 MHz. Then, as shown in FIG. 7E, the input audio signal IN is converted to a digital signal in the A/D conversion circuit 11at an interval defined by dotted lines of FIG. 7E.

The address signal generating circuit 29 also generates an address signal g for writing or reading in synchronism with the sampling signal e. After the input signal IN is A/D converted with the sampling signal e of 7.5 MHz, the frequency of the sampling signal e changes. Therefore, the output digital signal f of the A/D conversion circuit 11 is written in the memory 12 with the writing address signal g substantially in synchronism with the frequency of 7.5 MHz. After delay in the memory 12, the same output digital signal h is read from the memory 12 with the reading address signal g. Here, in the same address, a writing address is at a predetermined distance from a reading address, and the difference between the addresses becomes a delay time. While the output digital signal f is delayed in the memory 12, the frequency of the sampling signal e for the same output digital signal changes from 7.5 MHz to 8.5 MHz. Because of the change of the sampling signal e, the same output digital signal g is read with the reading address signal g substantially in synchronism with the sampling signal of 8.5 MHz. Since the frequency of the sampling signal e changes with an elapse of time, the frequency of the writing address signal differs from the frequency of the reading address signal for the same output digital signal f of the memory 12.

Also, in the above example, the difference in frequency of the sampling signals between the times of analog conversion and digital conversion for the same digital signal is 1 MHz. As mentioned above, if the time required for transmitting the output signal f of the A/D conversion circuit 11 to the D/A conversion circuit 13 is about half the cycle of the change in sampling frequency, in the case of the sampling frequency of 7.6 MHz at the time of A/D conversion, then the sampling frequency for the same digital signal at the time of D/A conversion is 8.4 MHz. The difference in frequency of the sampling signals is then 0.8 MHz. Therefore, the sampling interval at the time of D/A conversion becomes wider than an amplitude of the sampling frequency of 1 MHz. The cycle of the output analog signal i becomes longer than the case in which the difference in sampling frequency is 1 MHz. Therefore, with the sampling frequency at the time the input signal IN is applied to the A/D conversion circuit 11, one cycle of the output analog signal i corresponding to the input signal IN variously changes, so the frequency of the output analog signal g changes.

Therefore, when a certain input signal is applied to the A/D conversion circuit 11, the frequency of the output signal i from the D/A conversion circuit 13 corresponding to the same input signal changes depending on the sampling frequency for the A/D conversion and a direction of a change in sampling frequency. For example, when the sampling signal e changes as shown in FIG. 7D and an input signal of 1 KHz as shown in FIG. 4A is applied, the output analog signal g of the D/A conversion circuit 13 having dispersed frequency components as shown in FIG. 4B is obtained. The 1 KHz frequency is dispersed to other frequencies. Therefore, when the input signal IN of a certain frequency is applied to the A/D conversion circuit 11, the output signal i of the D/A conversion circuit 13 comprises various dispersed frequencies. Thereby, when the output signal i of the D/A conversion circuit 13 is superimposed on the input signal of the input terminal IN in the addition circuit 10, an output signal of the addition circuit 10 has an additional frequency component besides the frequency component of the input signal IN. The frequency component of the input signal IN can then be relatively small. By making small the frequency component of the input signal, a state in which the original audio signal and the echo signal are superimposed can be produced in an auditory simulation.

In the D/A conversion circuit 13, the digital signal h from the memory 12 is converted to the analog signal i by the sampling signal e. Since the sampling signal e changes as time elapses, the digital signal h is digital-converted with the sampling signal e of 8.5 MHz. Therefore, for the same digital signals f and h the sampling signal h at the time of digital conversion is 7.5 MHz, while the sampling signal h for analog conversion is 8.5 MHz. Specifically, since the sampling frequency changes with an elapse of time, the sampling frequency of the A/D conversion circuit 11 is different from the sampling frequency of the D/A conversion circuit 13 for the same digital signal.

Figure 7F:
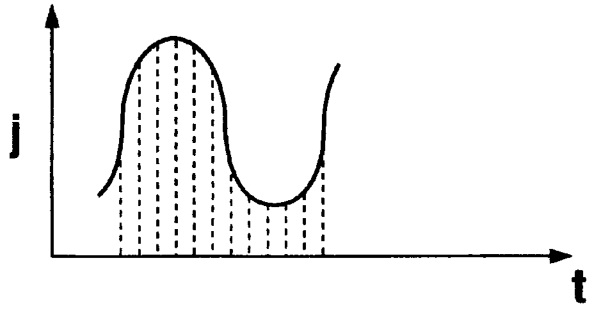

By converting the output digital signal h to an analog signal, the output analog signal i of the D/A conversion circuit 13 as shown in FIG. 7F is obtained. In FIG. 7F, an interval of analog conversion is narrower than an interval of digital conversion of the input signal IN on 7.5 MHz. Thereby, after a certain input signal is A/D converted on the sampling frequency of 7.5 MHz, the corresponding digital signal is D/A converted on the sampling frequency of 8.5 MHz. Then, as compared with the input signal of the input terminal IN, a cycle of the output analog signal i of the D/A conversion circuit 13 becomes shorter while its frequency becomes higher. Subsequently, the output analog signal i of the D/A conversion circuit 13 is added to the input signal IN in the addition circuit 10.

Consequently, in the same manner as in the first embodiment, the output signal shown in FIG. 4B can be obtained from the input signal IN shown in FIG. 4A.

Additionally, when a music signal is applied to the input terminal IN, a change in frequency of the sampling signal has no regularity, because the music signal has various frequencies. However, even if the change in frequency of the sampling signal has no regularity, the output signal of the A/D conversion circuit 11 is delayed in the memory 12 while the sampling frequencies for the same digital signal variously change between the time of A/D conversion and the time of D/A conversion. Therefore, even when a usual music signal is applied, a state where the original audio signal and the echo signal are superimposed can be simulated.

Figure 8:
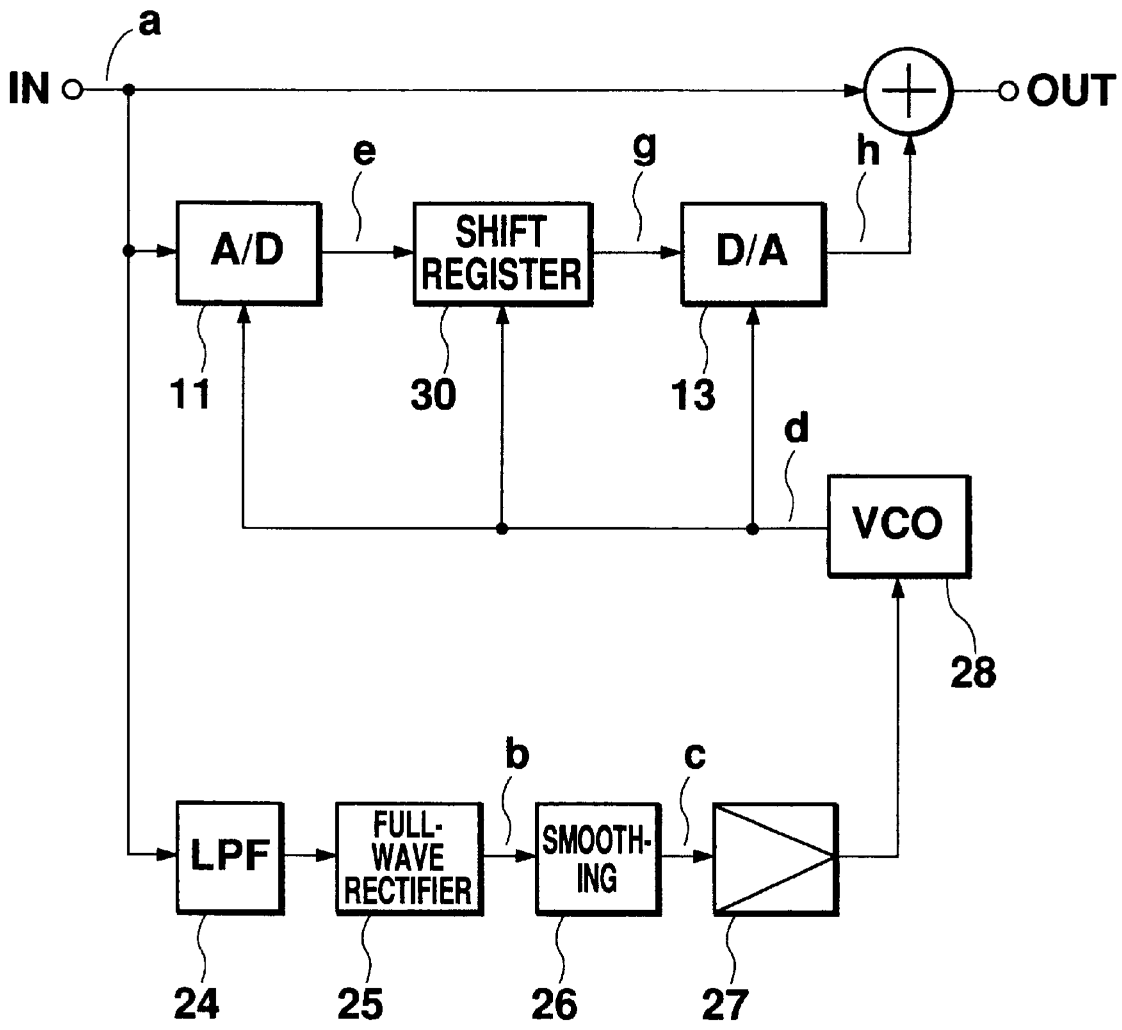
FIG. 8 shows a modification of the surround circuit of the second embodiment.

FIG. 8 shows a modification of the embodiment which differs from the embodiment of FIG. 6 in that the memory 12 of FIG. 6 is replaced with a N-step shift register 30. In the modification shown in FIG. 8, the sampling signal e from the VCO 28 is directly applied to the shift register 30. Shifting of data in the shift register 30 is performed by the sampling signal e. The output signal f of the A/D conversion circuit 11 is taken by the sampling signal e into the shift register 30 and shifted therein. A shift time of the N-step shift register 30 is a delay time. Since the frequency of the sampling signal e changes over time, the output signal f is shifted while a shift speed of the shift register 30 changes as time elapses. Therefore, for the same output digital signal, the frequency of the sampling signal e when the output digital signal f of the A/D conversion circuit 11 is applied to the shift register 30 differs from when the output digital signal is generated from the shift register 30. Therefore, the sampling frequencies of the A/D conversion circuit 11 and the D/A conversion circuit 13 for the same digital signal differ. On an output end of the D/A conversion circuit 13 another frequency component can therefore be generated in addition to the frequency component of the input signal of the input terminal IN. Therefore, by making the frequency component of the input signal of the input terminal IN relatively small, a state in which the original audio signal and the echo signal are superimposed can be simulated.

Third Embodiment

Figure 9:
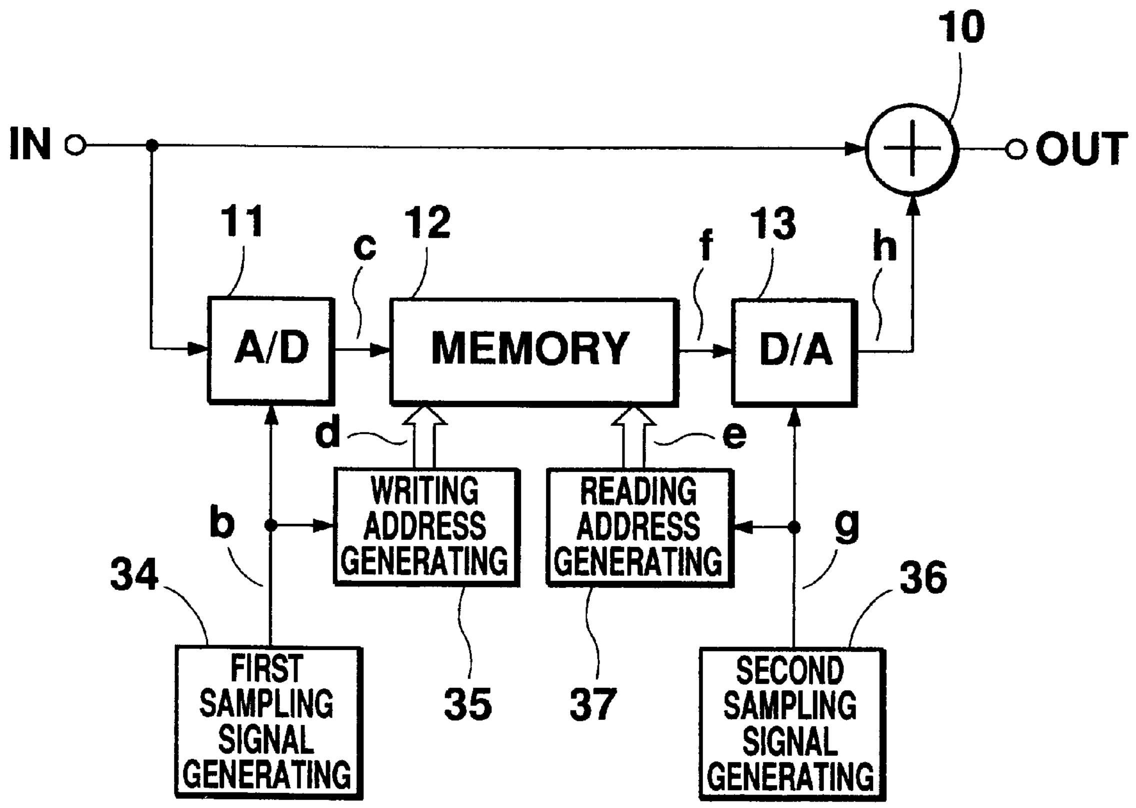
FIG. 9 is a block diagram showing a constitution of a surround circuit according to a third embodiment of the invention.

FIG. 9 shows a third embodiment, in which 11 is an A/D conversion circuit for converting an input audio signal to a digital signal with a first sampling signal having a fixed frequency, 12 is a memory constituting a delay circuit for delaying an output signal of the A/D conversion circuit 11, 13 is a D/A conversion circuit for converting an output signal of the memory 12 to an analog signal with a second sampling signal whose frequency changes over time, 34 is a first sampling signal generating circuit for generating the first sampling signal of the fixed frequency, 35 is a writing address signal generating circuit for generating a writing address signal of a fixed frequency in response to the first sampling signal, 36 is a second sampling signal generating circuit for generating a second sampling signal whose frequency changes over time, and 37 is a reading address signal generating circuit for generating a reading address signal whose frequency changes in response to the second sampling signal.

In FIG. 9, in the A/D conversion circuit 11, the input audio signal IN is converted from the first sampling signal generating circuit 34 to the digital signal c by the b fixed frequency sampling signal.

The output digital signal c of the A/D conversion circuit 11 corresponding to the input signal IN is stored in an address of the memory 12 which is designated by the writing address signal d of the writing address signal generating circuit 35. Since the writing address signal d is generated in synchronism with the first sampling signal b, the frequency of the writing address signal d is fixed. Also, for the same digital signal, the writing address is separated from the reading address by as much as a plurality of addresses and the delay time of the memory 12 is set by a difference in the addresses. After the delay time elapses, the same output digital signal f is read by the reading address signal e from the reading address signal generating circuit 37. The reading address signal e is generated in synchronism with the second sampling signal g of the second sampling signal generating circuit 36. Since the frequency of the second sampling signal g changes with time, the frequency of the reading address signal e also changes with time. Therefore, the reading from the memory 12 is performed not at every constant time, but at every time which is determined by the frequency of the sampling signal.

Subsequently, in the D/A conversion circuit 13, the output digital signal f from the memory 12 is converted to the analog signal h on the frequency of the second sampling signal g. Here, the frequency of the first sampling signal b is fixed while the frequency of the second sampling signal g changes with an elapse of time. Therefore, for the same digital signal the sampling signals at the time of analog conversion differ from at the time of digital conversion. The frequency of the output analog signal h therefore differs from the frequency of the input signal IN. Subsequently, the output signal h of the D/A conversion circuit 13 is added to the input signal of the input terminal IN in the addition circuit 10.

Figure 10A:
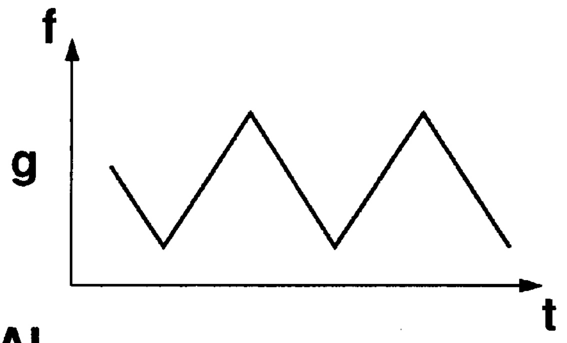
FIGS. 10A, 10B, 10C and 10D show waveforms of signals from respective portions of the surround circuit in the third embodiment.
Figure 10B:
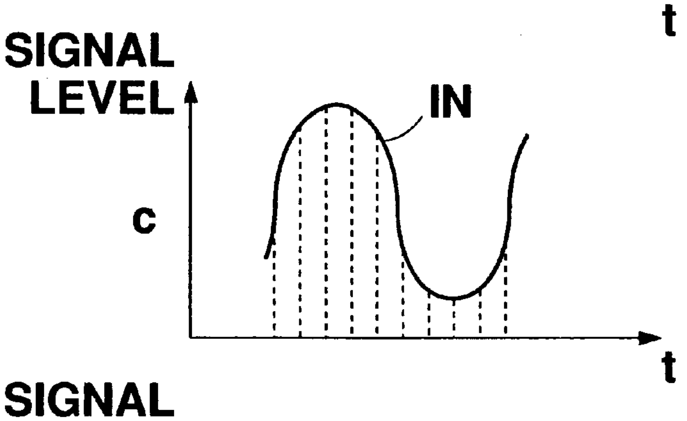

A state of input and output signals of the surround circuit shown in FIG. 9 is described using specific numeral values. First, the frequency of the first sampling signal b is fixed at 8.0 MHz and, as shown in FIG. 10A, the frequency of the second sampling signal g changes in a range of between 7.5 MHz and 8.5 MHz in a triangular waveform having a cycle 10 Hz. Since the sampling frequency of the A/D conversion circuit 11 is 8.0 MHz, as shown in FIG. 10B, the input signal IN is converted to a digital signal c at an interval defined by dotted lines in FIG. 10B. The output digital signal c is delayed in the memory 12 and thereafter converted to an analog signal h in the D/A conversion circuit 13.

Figure 10C:
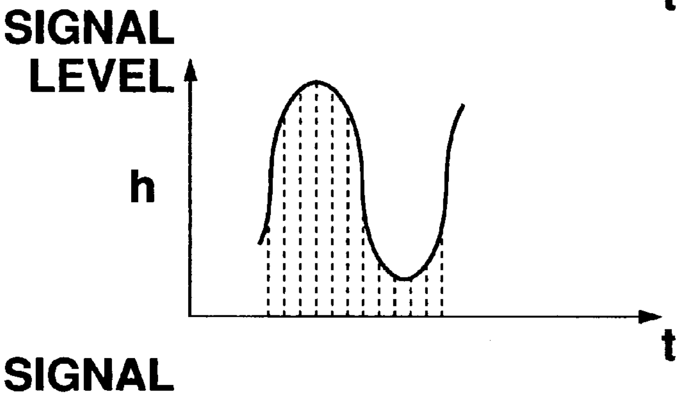

In this case, when the sampling frequency of the D/A conversion circuit 13 is 8.5 MHz, the output analog signal h of the D/A conversion circuit 13 as shown in FIG. 10C is obtained. In FIG. 10C, an interval of analog conversion is narrower than the interval of the digital conversion of the input signal IN on 8.0 MHz. Specifically, after a certain input signal is A/D converted on the sampling frequency of 8.0 MHz, the output digital signal f is D/A converted with a sampling frequency of 8.5 MHz. Thereby, a cycle of the output analog signal h of the D/A conversion circuit 13 is shorter and its frequency is higher as compared with the input signal of the input terminal IN.

Figure 10D:
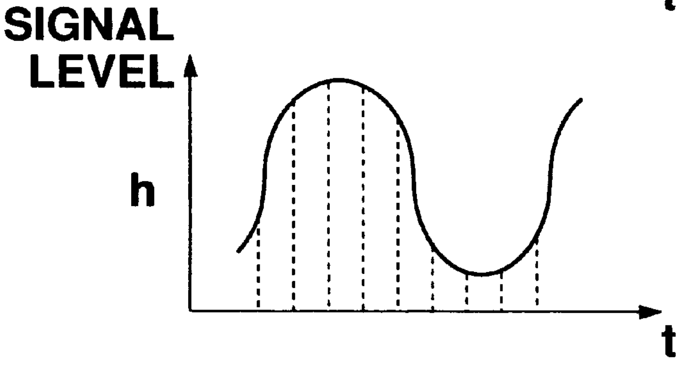

Also, when the sampling frequency of the D/A conversion circuit 13 is 7.5 MHz, the output analog signal h of the D/A conversion circuit 13 as shown in FIG. 10D is obtained. As shown in FIG. 10D, the interval of the analog conversion becomes wider than the interval of the A/D conversion. Therefore, by D/A converting the output digital signal f on the sampling frequency of 7.5 MHz, the cycle of the output analog signal h becomes longer and its frequency becomes lower as compared with the input signal of the input terminal IN.

Therefore, when the frequency of the second sampling signal g is higher than the first sampling signal b, the frequency of the output analog signal h becomes higher than the input signal IN. Conversely, when the frequency of the second sampling signal g is lower, the frequency of the output analog signal h becomes lower. Therefore, when as shown, for example, in FIG. 10A an input signal of a single frequency of 1 KHz is applied to the input terminal IN, the output analog signal h of the D/A conversion circuit 13 has various frequency components as shown in FIG. 10B. The frequency of 1 KHz is dispersed to the other frequencies. By giving a regularity to the change in frequency of the second sampling signal g, frequencies can be dispersed symmetrically centering on the frequency of the input signal IN. Specifically, the frequency of the output analog signal h is dispersed by alternately repeating a dispersing movement successively from 1 KHz to a high frequency and from that high frequency back to 1 KHz and a dispersing movement successively from 1 KHz to a low frequency and from the low frequency back to 1 KHz. Thereby, when in the addition circuit 10 the output signal h of the D/A conversion circuit 13 is superimposed on the input signal of the input terminal IN, an output signal of the addition circuit 10 has a frequency component in addition to the frequency component of the input signal. Therefore, the frequency component of the input signal of the input terminal IN can be made relatively small. By making the frequency component of the input signal small, a simulation of a state in which the original audio signal and the echo signal are superimposed can be produced.

Figure 11:
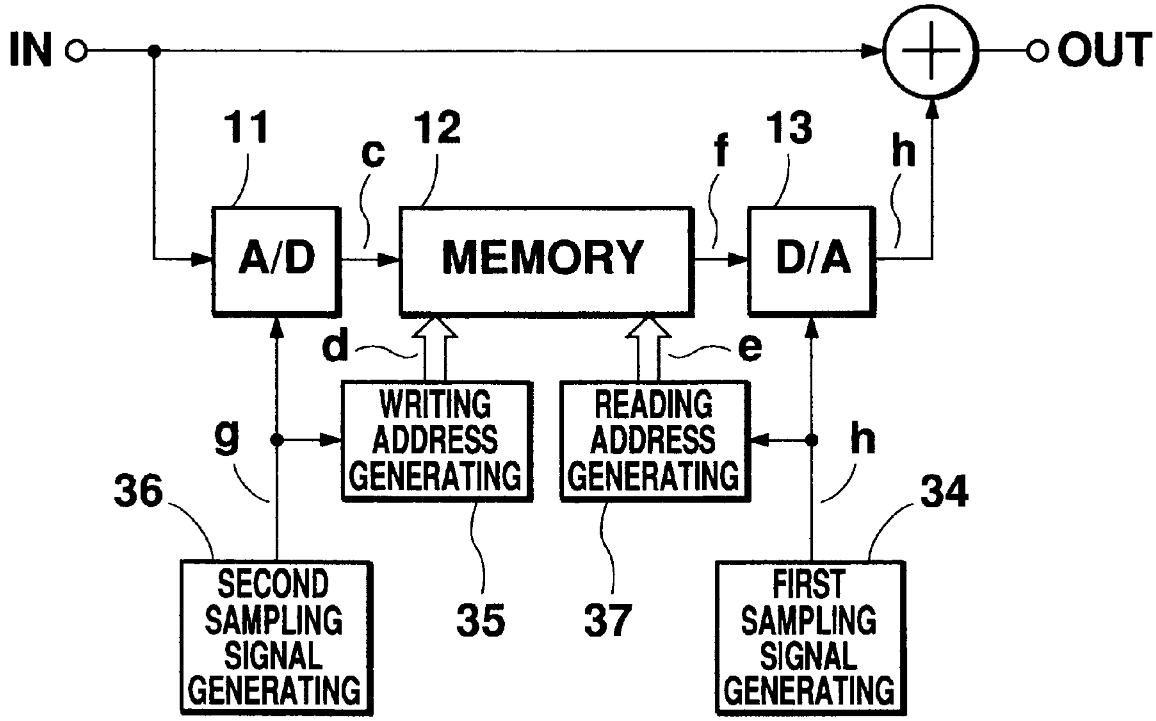
FIG. 11 shows a modification of the surround circuit of the third embodiment.

FIG. 11 shows a modification of the embodiment which differs from FIG. 9 in that the first sampling signal b of a fixed frequency is applied to the D/A conversion circuit 13 and the reading address signal generating circuit 37, while a second sampling signal g whose frequency changes with time is applied to the A/D conversion circuit 11 and the writing address signal generating circuit 35.

In the modification shown in FIG. 11, after the A/D conversion circuit 11 converts the input signal IN to the digital signal c on the sampling frequency which changes with time, and the digital signal c is stored in the memory 12 with the writing address signal d whose frequency changes over time. After the delay time elapses, the digital signal f is read from the memory 12 with the reading address signal e of the fixed frequency, and thereafter the output digital signal f is converted to the digital signal on the fixed sampling frequency.

Figure 12A:
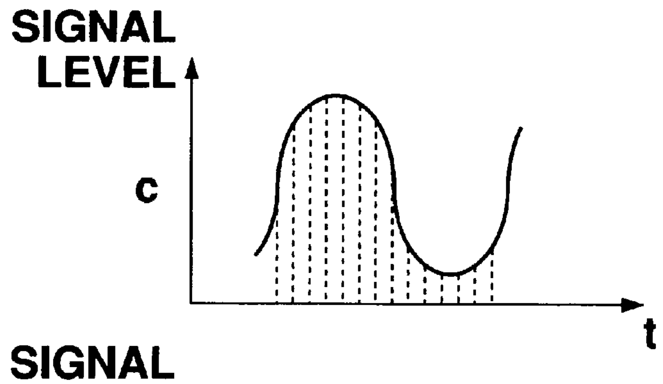
FIGS. 12A, 12B, 12C and 12D show waveforms of signals from respective portions of the surround circuit in the third embodiment.

In such a case, since the sampling frequency of the A/D conversion circuit 11 changes as shown in FIG. 10A, the interval of the digital conversion differs among the sampling frequencies. When the sampling frequency of the A/D conversion circuit 11 is 8.5 MHz, the input signal IN is converted to the digital signal c at narrow intervals as shown in FIG. 12A. Subsequently, the D/A conversion circuit 13 converts the output digital signal c to the analog signal h with the sampling signal b of 8.0 MHz. Therefore, as shown in FIG. 12C, the interval of the analog conversion becomes wider than the interval of the digital conversion of the input signal IN on 8.5 MHz and the cycle of the output analog signal h of the D/A conversion circuit 13 becomes longer and its frequency becomes lower as compared with the input signal of the input terminal IN.

Figure 12B:
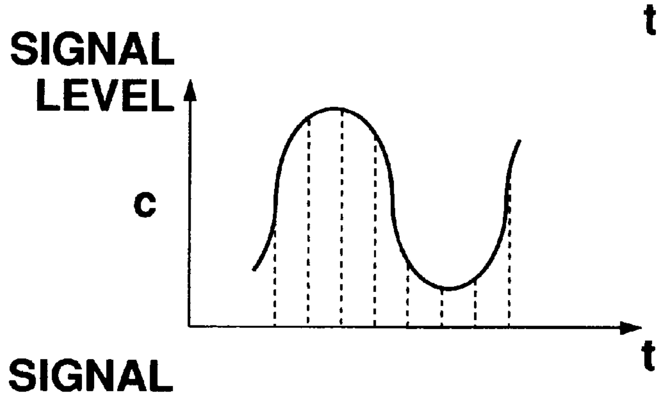
Figure 12C:
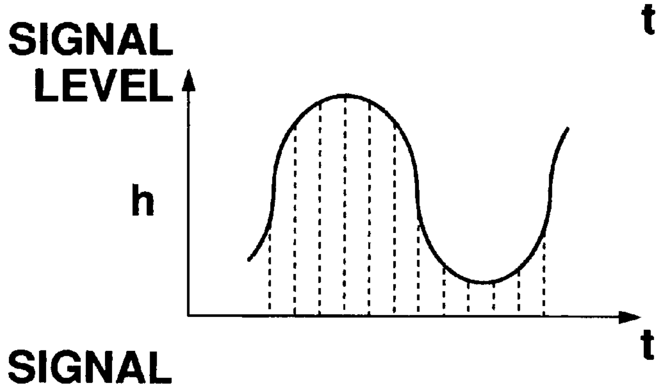
Figure 12D:
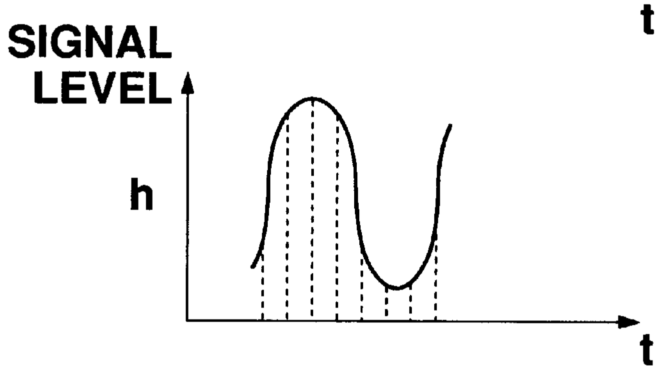

Also, when the sampling frequency of the A/D conversion circuit 11 is 7.5 MHz, the input signal IN is converted to a digital signal at wide intervals as shown in FIG. 12B. Subsequently, when the output digital signal is analog-converted in the D/A conversion circuit 13, as shown in FIG. 12D, the interval of the analog conversion becomes narrower than the interval of the digital conversion of the input signal IN on 7.5 MHz. The cycle of the output analog signal h of the D/A conversion circuit 13 therefore becomes shorter while its frequency becomes higher as compared with the input signal of the input terminal IN.

Consequently, when the frequency of the second sampling signal g is higher than that of the first sampling signal b, the frequency of the output analog signal h is lower than the input signal IN. Conversely, when the frequency of the second sampling signal g is low, the frequency of the output analog signal h becomes higher. In FIG. 4, for example, when the input signal of a single frequency of 1 KHz as shown in FIG. 4A is applied to the input terminal IN, in the same manner as in FIG. 1, the output analog signal h of the D/A conversion circuit 13 has the frequency of the input signal dispersed to the other frequencies as shown in FIG. 4B. Therefore, when the output signal of the D/A conversion circuit 13 is superimposed onto the input signal of the input terminal IN, frequency component can exist in the output signal of the addition circuit 10 in addition to the frequency component of the input signal. The frequency component of the input signal of the input terminal IN therefore becomes relatively small and a simulated state in which the original audio signal and the echo signal are superimposed can be produced.

Additionally, the embodiments of FIGS. 9 and 11 are different in frequencies of the writing address signal and the reading address signal. In some case no data exists in the address to be read, while in other case data still remains in the address to be written. Therefore, input data cannot be constantly supplied to the D/A conversion circuit 13, and the output analog signal h may become discontinuous. In such a case, a known method can be used. Specifically, when no data exists in the address to be read, the data at a certain address is repeatedly read until the address at which data exists is designated. When the data remains in the address to be written, the same writing address signal is generated until the data of the address is read out, and also the data to be written is flown to earth. Thereby, period of times during which no data exists are eliminated, and the continuity of the output analog signal h can be maintained.

What is claimed is:

1. A surround circuit for generating a delay signal of an input analog signal and superimposing the delay signal to the input analog signal, which comprises:

- a A/D conversion circuit for converting the input analog signal to a digital signal;
- a delay circuit for delaying an output digital signal of said A/D conversion circuit;
- a D/A conversion circuit for converting an output signal of said delay circuit to an analog signal; and
- a sampling signal generating circuit for generating a sampling signal for sampling of said A/D conversion circuit and said D/A conversion circuit and for continuously changing with elapsed time a frequency of the sampling signal which is supplied to said A/D conversion circuit and said D/A conversion circuit, the delay signal of the input analog signal being obtained from an output of the D/A conversion circuit.

2. The surround circuit according to claim 1 wherein said sampling signal generating circuit repeatedly and alternately increases and decreases the frequency of said sampling signal within a predetermined range of frequencies.

3. The surround circuit according to claim 1 wherein said sampling signal generating circuit randomly changes the frequency of said sampling signal.

4. The surround circuit according to claim 1 which further comprises:

- a full-wave rectifier circuit for full-wave rectifying said input analog signal; and
- a smoothing circuit for smoothing an output signal of said full-wave rectifier circuit, and wherein
- said sampling signal generating circuit changes the frequency of said sampling signal in accordance with an output signal of said smoothing circuit.

5. The surround circuit according to claim 4 wherein said sampling signal generating circuit has a voltage control oscillator (VCO), the oscillating frequency of which is controlled in accordance with the output signal of the smoothing circuit.

6. The surround circuit according to claim 1 wherein said delay circuit includes:

- an address signal generating circuit for generating writing and reading address signals in response to said sampling signal;
- a memory to which the output digital signal of said A/D conversion circuit is written in response to said writing address signal and from which said written signal is read in response to said reading address signal.

7. The surround circuit according to claim 1 wherein said delay circuit uses said sampling signal as a clock and has a shift register for successively shifting the output digital signal of said A/D conversion circuit.

8. A surround circuit for generating a delay signal of an input analog signal and superimposing the delay signal to the input analog signal, which comprises:

- a A/D conversion circuit for converting the input analog signal to a digital signal;
- a delay circuit for delaying an output digital signal of said A/D conversion circuit;

a D/A conversion circuit for converting an output signal of said delay circuit to an analog signal, the delay signal of the input analog signal being obtained from an output of the D/A conversion circuit;

a first sampling signal generating circuit for generating a first sampling signal of a fixed frequency and supplying said first sampling signal to one of said A/D conversion circuit and said D/A conversion circuit; and a second sampling signal generating circuit for generating a second sampling signal whose frequency changes with an elapse of time and for supplying said second sampling signal to the other one of said A/D conversion circuit and said D/A conversion circuit.

9. The surround circuit according to claim 8 wherein said first sampling signal is applied to said A/D conversion circuit and said second sampling signal is applied to said D/A conversion circuit, and said delay circuit includes:

a writing address signal generating circuit for generating a writing address signal in response to said first sampling signal;

a reading address signal generating circuit for generating a reading address signal in response to said second sampling signal; and a memory to which the output digital signal of said A/D conversion circuit is written in response to said writing address signal, and from which the digital signal forming the input signal of said D/A conversion circuit is read in response to said reading address signal.

10. The surround circuit according to claim 8 wherein said first sampling signal is applied to said D/A conversion circuit and said second sampling signal is applied to said A/D conversion circuit, and said delay circuit includes:

a reading address signal generating circuit for generating a reading address signal in response to said first sampling signal;

a writing address signal generating circuit for generating a writing address signal in response to said second sampling signal; and a memory to which the output digital signal of said A/D conversion circuit is written in response to said writing address signal, and from which the digital signal forming the input signal of said D/A conversion circuit is read in response to said reading address signal.

11. The surround circuit of claim 8, wherein the second sampling signal generating circuit repeatedly and alternately increases and decreases the frequency of the second sampling signal within a predetermined range of frequencies.

12. The surround circuit of claim 8, wherein the second sampling signal generating circuit randomly changes the frequency of the second sampling signal.

13. The surround circuit according to claim 8 which further comprises:

a full-wave rectifier circuit for full-wave rectifying said input analog signal; and a smoothing circuit for smoothing an output signal of said full-wave rectifier circuit, and wherein said second sampling signal generating circuit changes the frequency of said second sampling signal in accordance with an output signal of said smoothing circuit.

14. The surround circuit according to claim 13 wherein said second sampling signal generating circuit has a voltage control oscillator (VCO), the oscillating frequency of which is controlled in accordance with the output signal of the smoothing circuit.

15. The surround circuit according to claim 8 wherein said delay circuit includes:

a writing address signal generating circuit for generating a writing address signal in response to one of said first and second sampling signal;

a reading address signal generating circuit for generating a reading address signal in response to the other one of said first and second sampling signal; and a memory to which the output digital signal of said A/D conversion circuit is written in response to said writing address signal and from which said written signal is read in response to said reading address signal.

16. The surround sound circuit according to claim 8 wherein said delay circuit uses said second sampling signal as a clock and has a shift register for successively shifting the output digital signal of said A/D conversion circuit.

17. The surround circuit of claim 8, wherein the first and second sampling signals are generated based on an output of a single clock generating circuit.

18. The surround circuit of claim 8, wherein the first and second sampling signals are continuously changed.

19. A surround circuit for generating a delay signal of an input analog signal and superimposing the delay signal to the input analog signal, which comprises:

a A/D conversion circuit for converting the input analog signal to a digital signal;

a delay circuit for delaying an output digital signal of said A/D conversion circuit;

a D/A conversion circuit for converting an output signal of said delay circuit to an analog signal; and a sampling signal generating circuit for generating a sampling signal for sampling of said A/D conversion circuit and said D/A conversion circuit and for randomly changing with elapsed time a frequency of the sampling signal which is supplied to said A/D conversion circuit and/or said D/A conversion circuit, the delay signal of the input analog signal being obtained from an output of the D/A conversion circuit.

20. The surround circuit according to claim 19 wherein said delay circuit includes:

an address signal generating circuit for generating writing and reading address signals in response to said sampling signal;

a memory to which the output digital signal of said A/D conversion circuit is written in response to said writing address signal and from which said written signal is read in response to said reading address signal.

21. The surround sound circuit according to claim 19 wherein said delay circuit uses said sampling signal as a clock and has a shift register for successively shifting the output digital signal of said A/D conversion circuit.

22. A method of processing an input analog signal comprising:

converting the input analog signal to a digital signal using a first sampling frequency;

delaying the converted digital signal; and converting the delayed digital signal to a second analog signal using a second sampling frequency, wherein both the first and second sampling frequencies are continuously changed.

23. The method of claim 22, wherein at least one of the first and second sampling frequency is repeatedly and alternately increased and decreased within a predetermined frequency range.

24. The method of claim 22, wherein at least one of the first and second sampling frequency is randomly changed.

25. The method of claim 22, wherein at least one of the first and second sampling frequency is changed according to a level of the input analog signal.

26. The method of claim 22, further comprising superimposing the second analog signal on the input analog signal to generate an output analog signal.

27. A method of processing an input analog signal comprising:

converting the input analog signal to a digital signal using a first sampling frequency;

delaying the converted digital signal; and converting the delayed digital signal to a second analog signal using a second sampling frequency, wherein at least one of the first and second sampling frequencies is randomly changed.

28. The method of claim 27, further comprising superimposing the second analog signal on the input analog signal to generate an output analog signal.

29. The method of claim 27, wherein at least one of the first and second sampling frequency is repeatedly and alternately increased and decreased within a predetermined frequency range.

30. The method of claim 27, wherein at least one of the first and second sampling frequency is continuously changed.

31. The method of claim 27, wherein at least one of the first and second sampling frequency is changed according to a level of the input analog signal.

32. The method of claim 27, further comprising superimposing the second analog signal on the input analog signal to generate an output analog signal.

* * * * *